(12) United States Patent
Chen et al.

(10) Patent No.: US 10,636,967 B2
(45) Date of Patent: Apr. 28, 2020

(54) METHOD FOR MANUFACTURING ELECTRODE AND RESISTIVE RANDOM ACCESS MEMORY

(71) Applicant: Winbond Electronics Corp., Taichung (TW)

(72) Inventors: Yi-Chung Chen, Taichung (TW); Cheng-An Peng, Taichung (TW); Shuo-Che Chang, Taichung (TW); Sung-Ying Wen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/508,322

(22) Filed: Jul. 11, 2019

(65) Prior Publication Data

US 2019/0334087 A1  Oct. 31, 2019

Related U.S. Application Data

(63) Continuation of application No. 15/263,392, filed on Sep. 13, 2016, now abandoned.

(30) Foreign Application Priority Data

Mar. 3, 2016  (CN) .......................... 2016 1 0121062

(51) Int. Cl.
*H01L 45/00*  (2006.01)

(52) U.S. Cl.
CPC .......... *H01L 45/1625* (2013.01); *H01L 45/04* (2013.01); *H01L 45/124* (2013.01); *H01L 45/1233* (2013.01); *H01L 45/1253* (2013.01); *H01L 45/146* (2013.01); *H01L 45/16* (2013.01); *H01L 45/1616* (2013.01)

(58) Field of Classification Search
CPC ....... H01L 2924/00; H01L 2224/32225; H01L 2224/48227; H01L 2224/73265; H01L 2224/73204
See application file for complete search history.

(56) References Cited

U.S. PATENT DOCUMENTS

| | | | |
|---|---|---|---|
| 2015/0056795 A1* | 2/2015 | Kang | H01L 29/785 438/585 |
| 2015/0091100 A1* | 4/2015 | Xie | H01L 21/76224 257/401 |

* cited by examiner

*Primary Examiner* — Tony Tran
(74) *Attorney, Agent, or Firm* — JCIPRNET

(57) ABSTRACT

A method for manufacturing an electrode including the following steps is provided. A conductive layer is formed on a base material. A radio frequency physical vapor deposition (RF PVD) transition metal compound layer is formed on the conductive layer by using a RF PVD. A sacrificial layer is formed on the RF PVD transition metal compound layer. A planarization process is performed to remove the sacrificial layer and a portion of the RF PVD transition metal compound layer.

8 Claims, 2 Drawing Sheets

METHOD FOR MANUFACTURING ELECTRODE AND RESISTIVE RANDOM ACCESS MEMORY

CROSS-REFERENCE TO RELATED APPLICATION

This application is a continuation application of and claims the priority benefit of a prior application Ser. No. 15/263,392, filed on Sep. 13, 2016, which claims the priority benefit of China application serial no. 201610121062.7, filed on Mar. 3, 2016. The entirety of each of the above-mentioned patent applications is hereby incorporated by reference herein and made a part of this specification.

BACKGROUND OF THE INVENTION

Field of the Invention

The invention relates to a method for manufacturing a conductive component and a memory, and particularly relates to a method for manufacturing an electrode having a flat surface and a lower electrode of a resistive random access memory (RRAM) using the same.

Description of Related Art

In recent years, with the progress and the development of science and technology, more and more electronic products appear on the market, wherein a memory plays an important role. In addition to storing data of users, the memory is also responsible for the storage of the code executed by the central processing unit, and the information required to be temporarily stored in the operation process. In a new generation of non-volatile memory, Resistive Random Access Memory (RRAM) is one of the most concerned technologies because of its advantages of simple structure, low power consumption, high operation speed, and high density integration. The RRAM includes a metal-insulator-metal (MIM) structure, which can be switched in a high resistance state (HRS) and a low resistance state (LRS) by applying a voltage.

In recent years, there are a lot of research on the RRAM, such as the research on characteristics of dielectric layer materials, thermal annealing characteristics, and characteristics of electrode materials. The material which is commonly used as an electrode of the non-volatile memory is platinum (Pt), aluminum (Al), or copper (Au), wherein the grain boundary of the electrode formed by a general physical vapor deposition (PVD) is quite obvious. Thus, pin holes are easily formed in the electrode in the process of performing a cleaning process, such that a surface of the electrode is rough, thereby reducing the electrical performance of the device. Additionally, an oxygen content of the electrode formed by the general PVD is higher, which may cause the poor electrical performance of the device.

Furthermore, in the RRAM, the requirement of the surface flatness of a lower electrode is higher, and thus a chemical mechanical polishing process is usually used to improve the surface flatness of the lower electrode. However, a thickness of the lower electrode is reduced by using the chemical mechanical polishing process, thereby affecting the electrical performance of the device.

SUMMARY OF THE INVENTION

The invention provides a method for manufacturing an electrode, which can form the electrode having a flat and compact surface and a sufficient thickness.

The invention provides a resistive random access memory. A lower electrode thereof has a conductive layer and a radio frequency physical vapor deposition (RF PVD) transition metal compound layer. The lower electrode has the flat and compact surface and the sufficient thickness so that the resistive random access memory may have a better electrical performance.

The invention provides a method for manufacturing an electrode including the following steps. A conductive layer is formed on a base material by physical vapor deposition or chemical vapor deposition. An RF PVD transition metal compound layer is formed on the conductive layer by using a RF PVD. A sacrificial layer is formed on the RF PVD transition metal compound layer, wherein the sacrificial layer completely covers and physically contacts an entire top surface of the RF PVD transition metal compound layer, wherein the conductive layer, the RF PVD transition metal compound layer, and the sacrificial layer comprise a same material of titanium nitride, and the RF PVD transition metal compound layer has a more compact structure and a lower oxygen content than the conductive layer and the sacrificial layer. A planarization process is performed to remove the sacrificial layer and a portion of the RF PVD transition metal compound layer underlying the sacrificial layer, wherein the sacrificial layer is completely removed by the planarization process, such that an entire top surface of a remained RF PVD transition metal compound layer is completely exposed. The conductive layer is not removed by the planarization process, and after performing the planarization process, a topmost surface of the conductive layer is covered by the remained RF PVD transition metal compound layer, and is lower than a topmost surface of the remained RF PVD transition metal compound layer, and a bottommost surface of the conductive layer is higher than a topmost surface of the base material.

According to an embodiment of the invention, in the method for manufacturing the electrode, a material of each of the conductive layer and the sacrificial layer is titanium nitride, titanium, tantalum nitride, or a combination thereof, for example.

According to an embodiment of the invention, in the method for manufacturing the electrode, a method of forming the conductive layer and the sacrificial layer is a physical vapor deposition (PVD) or a chemical vapor deposition (CVD), for example.

According to an embodiment of the invention, in the method for manufacturing the electrode, before forming the conductive layer, the method further includes forming an adhesive layer on the base material, and a material of the adhesive layer is titanium, tantalum, indium tin oxide, or a combination thereof, for example.

According to an embodiment of the invention, in the method for manufacturing the electrode, a method of forming the adhesive layer is a PVD or a CVD, for example.

According to an embodiment of the invention, the method for manufacturing the electrode may be used for manufacturing a lower electrode of a resistive random access memory (RRAM).

According to an embodiment of the invention, in the method for manufacturing the electrode, the base material comprises a substrate, a conductive layer and a plug over the substrate and embedded in a dielectric structure.

According to an embodiment of the invention, in the method for manufacturing the electrode, further comprises forming a variable resistance layer on the remained RF PVD transition metal compound, and forming an upper electrode on the variable resistance layer, wherein the lower electrode, the variable resistance layer and the upper electrode together constitute the resistive random access memory.

According to an embodiment of the invention, in the method for manufacturing the electrode, after the planarization process, a thickness of the RF PVD transition metal compound layer is reduced.

According to an embodiment of the invention, in the method for manufacturing the electrode, the entire top surface of the remained RF PVD transition metal compound layer is flat and in a same planar, and an entire top surface of the conductive layer is flat and in a same planar.

According to an embodiment of the invention, in the method for manufacturing the electrode, after performing the planarization process, the topmost surface of the conductive layer is completely covered by the remained RF PVD transition metal compound layer.

The invention provides a resistive random access memory including a base material, a lower electrode, a variable resistance layer, and an upper electrode. The lower electrode includes a conductive layer and an RF PVD transition metal compound layer. The conductive layer is disposed on the base material. The RF PVD transition metal compound layer is disposed on the conductive layer. The variable resistance layer is disposed on the RF PVD transition metal compound layer. The upper electrode is disposed on the variable resistance layer.

According to an embodiment of the invention, in the resistive random access memory, the lower electrode further includes an adhesive layer. The adhesive layer is disposed between the base material and the conductive layer. A material of the adhesive layer is titanium, tantalum, indium tin oxide, or a combination thereof, for example.

According to an embodiment of the invention, in the resistive random access memory, a material of the conductive layer is titanium nitride, titanium, tantalum nitride, or a combination thereof, for example.

According to an embodiment of the invention, in the resistive random access memory, a thickness of the RF PVD transition metal compound layer may be between 10 nm and 20 nm.

Based on the above, in the method for manufacturing the electrode provided by the invention, since the sacrificial layer can provide the required removal amount for the planarization process, after removing the sacrificial layer and the portion of the RF PVD transition metal compound layer by using the planarization process, the RF PVD transition metal compound layer having the flat and compact surface and the sufficient thickness can be formed, thereby improving the electrical performance of the device.

Additionally, in the resistive random access memory provided by the invention, since the lower electrode is a multi-layer structure having the conductive layer and the RF PVD transition metal compound layer, the resistive random access memory may have the better electrical performance.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
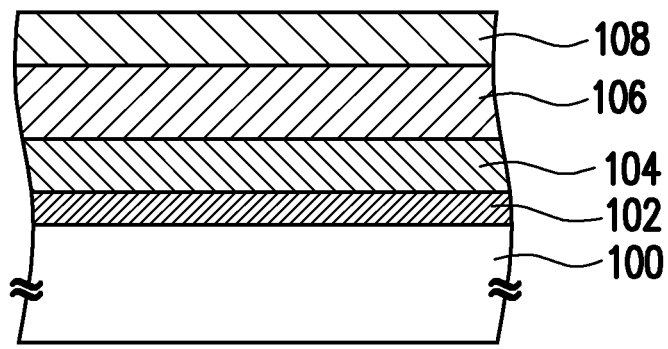
FIG. 1A to FIG. 1B are cross-sectional views illustrating a manufacturing process of an electrode according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1B:
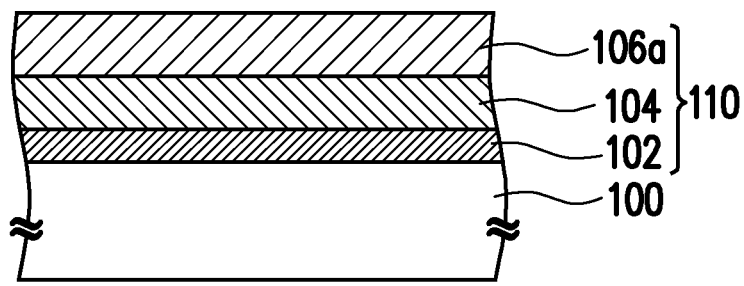

FIG. 1A to FIG. 1B are cross-sectional views illustrating a manufacturing process of an electrode according to an embodiment of the invention.

Referring to FIG. 1A, an adhesive layer 102 may be selectively formed on a base material 100. The base material 100 may be used for carrying the electrode. The base material 100 may be a dielectric layer, a conductive layer, or a substrate having the aforementioned layers. A person having ordinary skill in the art may select the type of the base material 100 according to the product design requirements.

The adhesive layer 102 is selected from the material with good adhesion to the base material 100 and a conductive layer 104 subsequently deposited. A material of the adhesive layer 102 is titanium, tantalum, indium tin oxide, or a combination thereof, for example. A method of forming the adhesive layer 102 is a PVD or a CVD, for example.

The conductive layer 104 is formed on the adhesive layer 102. The conductive layer 104 may be used for reducing the electrode impedance. The conductive layer 104 may be a single-layer structure or a multi-layer structure. A material of the conductive layer 104 is titanium nitride, titanium, tantalum nitride, or a combination thereof, for example. A method of forming the conductive layer 104 is a PVD or a CVD, for example. It should be noted that, the adhesive layer 102 may be omitted, and the conductive layer 104 is directly formed on the base material 100.

A radio frequency physical vapor deposition (RF PVD) transition metal compound layer 106 is formed on the conductive layer 104 by using a RF PVD. In comparison of a PVD transition metal compound layer and a CVD transition metal compound layer, the RF PVD transition metal compound layer 106 has a more compact structure and a lower oxygen content and thus having a better electrical property. Pin holes are hardly formed in the RF PVD transition metal compound layer 106 during the following cleaning process, and hence the RF PVD transition metal compound layer 106 has a flatter surface. The transition metal compound is titanium nitride, for example.

Additionally, when the conductive layer 104 is formed by using the PVD, the conductive layer 104 and the RF PVD transition metal compound layer 106 can be formed in the same PVD machine in different chambers. Thus, the conductive layer 104 and the RF PVD transition metal compound layer 106 can be formed without changing the machine, thereby reducing the processing time effectively.

A sacrificial layer 108 is formed on the RF PVD transition metal compound layer 106. The sacrificial layer 108 may be used for providing the required removal amount for the planarization process. The sacrificial layer 108 may be a single-layer structure or a multi-layer structure. A material of the sacrificial layer 108 may be a conductive material, such as titanium nitride, titanium, tantalum nitride, or a combination thereof. A method of forming the sacrificial layer 108 is a PVD or a CVD, for example.

Additionally, when the sacrificial layer 108 is formed by using the PVD, the sacrificial layer 108 and the RF PVD transition metal compound layer 106 can be formed in the same PVD machine in different chambers. Thus, the sacrificial layer 108 and the RF PVD transition metal compound layer 106 can be formed without changing the machine, thereby reducing the processing time effectively.

Referring to FIG. 1B, a planarization process is performed to remove the sacrificial layer 108 and a portion of the RF PVD transition metal compound layer 106, so as to form a RF PVD transition metal compound layer 106a having a flat surface and a compact structure. Additionally, in the process of performing the planarization process, the sacrificial layer 108 can provide the required removal amount for the planarization process. Therefore, the RF PVD transition metal compound layer 106a can be formed with a sufficient thickness, and it can effectively exhibit an excellent electrical property thereof. The planarization process is a chemical mechanical polishing process, for example. For instance, a thickness of the RF PVD transition metal compound layer 106a may be more than 10 nm. In an embodiment, the thickness of the RF PVD transition metal compound layer 106a is between 10 nm and 20 nm.

At this time, according to an embodiment of the invention, the formed electrode 110 includes the adhesive layer 102, the conductive layer 104, and the planarized RF PVD transition metal compound layer 106a sequentially stacked disposed. The electrode 110 may be used as an electrode of various semiconductor devices. For instance, the electrode 110 may be used as an electrode of a resistive random access memory, such as a lower electrode.

Based on the above embodiments, since the sacrificial layer 108 can provide the required removal amount for the planarization process, after removing the sacrificial layer 108 and the portion of the RF PVD transition metal compound layer 106 by using the planarization process, the RF PVD transition metal compound layer 106a with the flat surface, the compact structure and having the sufficient thickness can be formed, thereby improving the electrical performance of the electrode 110.

Figure 2:
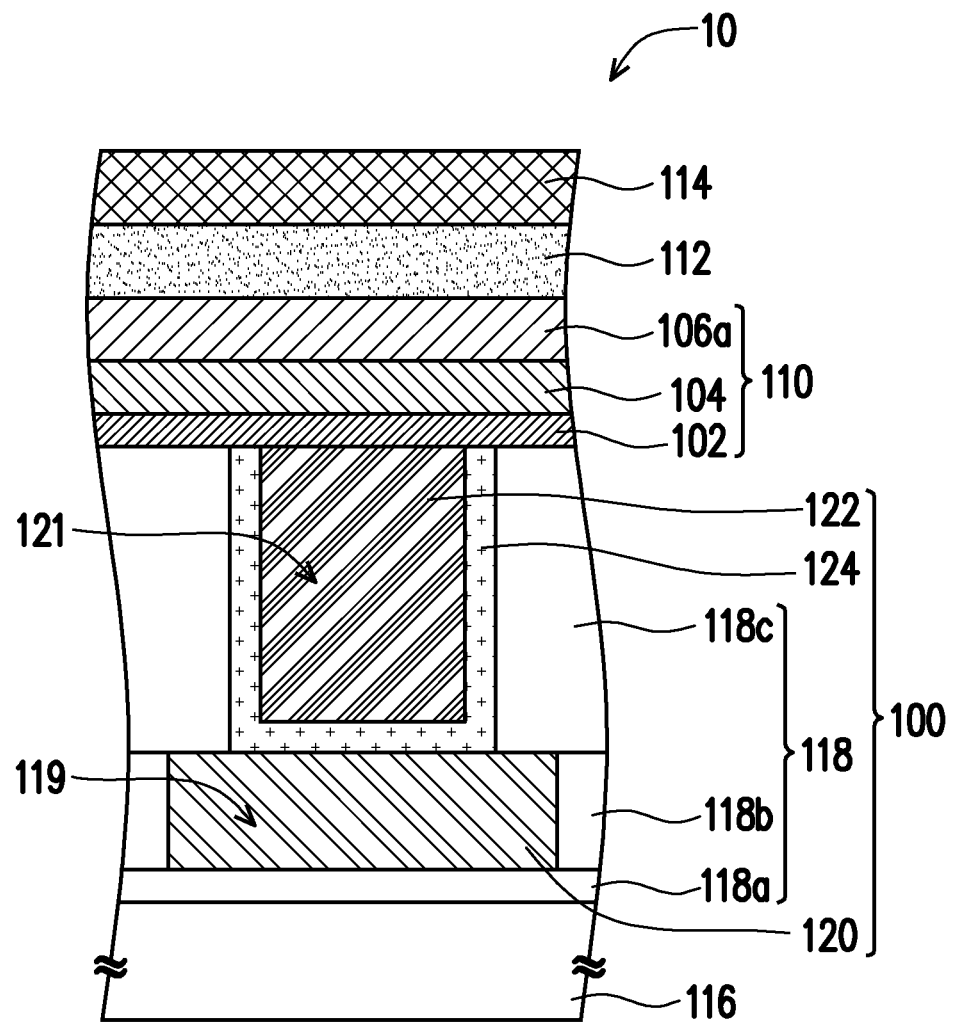
FIG. 2 is a cross-sectional view of a resistive random access memory according to an embodiment of the invention.

FIG. 2 is a cross-sectional view of a resistive random access memory according to an embodiment of the invention.

Referring to FIG. 2, a resistive random access memory 10 includes the base material 100, the electrode 110, a variable resistance layer 112, and an upper electrode 114.

The structure of the base material 100 in FIG. 2 is as an example for illustration; however, the invention is not limited thereto. A person having ordinary skill in the art may select the type of the base material 100 according to the product design requirements. In the present embodiment, the base material 100 may include a substrate 116, a dielectric structure 118, a conductive layer 120, a plug 122, and a barrier layer 124. The substrate 116 may be a semiconductor substrate, for example (e.g., a silicon substrate).

The dielectric structure 118 includes dielectric layers 118a, 118b and 118c sequentially disposed on the substrate 116. A material of each of the dielectric layers 118a, 118b and 118c is silicon oxide, silicon nitride, or silicon oxynitride, for example. A method of forming each of the dielectric layers 118a, 118b and 118c is a thermal oxidation method or a CVD, for example. In the present embodiment, the dielectric structure 118 is illustrated by a three-layer structure as an example; however, the invention is not limited thereto. A person having ordinary skill in the art can adjust the number of layers of the dielectric structure 118 according to the product and the manufacturing process requirements.

The conductive layer 120 is disposed on the dielectric layer 118a and located in an opening 119 of the dielectric layer 118b. A material of the conductive layer 120 is metal, such as aluminum or copper. A method of forming the conductive layer 120 includes performing a damascene process, for example.

The plug 122 is disposed on the conductive layer 120 and located in an opening 121 of the dielectric layer 118c. A material of the plug 122 is metal, such as tungsten or copper. A method of forming the plug 122 includes performing a damascene process, for example.

The barrier layer 124 is disposed between the plug 122 and the dielectric layer 118c and between the plug 122 and the conductive layer 120. A material of the barrier layer 124 is titanium nitride, titanium, or a combination thereof, for example. A method of forming the barrier layer 124 is a PVD or a CVD, for example.

The electrode 110 includes the conductive layer 104 and the RF PVD transition metal compound layer 106a. The electrode 110 is manufactured following the aforementioned method for manufacturing the electrode. In the present embodiment, the electrode 110 is used as the lower electrode of the resistive random access memory 10. The conductive layer 104 is disposed on the base material 100. The RF PVD transition metal compound layer 106a is disposed on the conductive layer 104. Additionally, the electrode 110 may further include the adhesive layer 102. The adhesive layer 102 is disposed between the base material 100 and the conductive layer 104. The material, the forming method, and the effect of the adhesive layer 102, the conductive layer 104, and the RF PVD transition metal compound layer 106a in the electrode 110 have been illustrated in the embodiment of FIG. 1, and thus it will not be repeated herein.

The variable resistance layer 112 is disposed on the RF PVD transition metal compound layer 106a. A material of the variable resistance layer 112 is a variable resistance material, such as transition metal oxide. The transition metal oxide is hafnium oxide, titanium oxide, zirconium oxide, zinc oxide, or other suitable metal oxide, for example. A method of forming the variable resistance layer 112 is a PVD, a CVD, or an atomic layer deposition (ALD), for example.

The upper electrode 114 is disposed on the variable resistance layer 112, and the upper electrode 114 may be a single-layer structure or a multi-layer structure. A material of the upper electrode 114 is titanium nitride, tantalum nitride, titanium, or tantalum, for example. A method of forming the upper electrode 114 is a PVD or a CVD, for example.

Based on the above embodiments, since the electrode 110 is the multi-layer structure having the conductive layer 104 and the RF PVD transition metal compound layer 106a, the resistive random access memory 10 may have a better electrical performance.

In summary, by the method for manufacturing the electrode of the embodiment, the RF PVD transition metal compound layer with the flat surface and the compact structure and having the sufficient thickness can be formed, thereby effectively improving the electrical performance of the device. Additionally, the resistive random access memory 10 of the embodiment has the lower electrode formed from the multi-layer structure. Thus, the resistive random access memory may have the better electrical performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method for manufacturing an electrode, comprising:
    forming a conductive layer on a base material by physical vapor deposition or chemical vapor deposition;
    forming a radio frequency physical vapor deposition (RF PVD) transition metal compound layer on the conductive layer by using a RF PVD;
    forming a sacrificial layer on the RF PVD transition metal compound layer, wherein the sacrificial layer completely covers and physically contacts an entire top surface of the RF PVD transition metal compound layer, wherein the conductive layer, the RF PVD transition metal compound layer, and the sacrificial layer comprise a same material of titanium nitride, and the RF PVD transition metal compound layer has a more compact structure and a lower oxygen content than the conductive layer and the sacrificial layer; and
    performing a planarization process to remove the sacrificial layer and a portion of the RF PVD transition metal compound layer underlying the sacrificial layer, wherein the sacrificial layer is completely removed by the planarization process, such that an entire top surface of a remained RF PVD transition metal compound layer is completely exposed,
    wherein the conductive layer is not removed by the planarization process, and after performing the planarization process, a topmost surface of the conductive layer is covered by the remained RF PVD transition metal compound layer, and is lower than a topmost surface of the remained RF PVD transition metal compound layer, and a bottommost surface of the conductive layer is higher than a topmost surface of the base material,
    wherein the method for manufacturing the electrode is used for manufacturing a lower electrode of a resistive random access memory,
    wherein the base material comprises a substrate, a conductive layer and a plug over the substrate and embedded in a dielectric structure, and
    further comprises forming a variable resistance layer on the remained RF PVD transition metal compound, and forming an upper electrode on the variable resistance layer, wherein the lower electrode, the variable resistance layer and the upper electrode together constitute the resistive random access memory.

2. The method for manufacturing the electrode according to claim 1, wherein a material of each of the conductive layer and the sacrificial layer comprises titanium nitride, titanium, tantalum nitride, or a combination thereof.

3. The method for manufacturing the electrode according to claim 1, wherein a method of forming the sacrificial layer comprises a physical vapor deposition (PVD) or a chemical vapor deposition (CVD).

4. The method for manufacturing the electrode according to claim 1, before forming the conductive layer, further comprising forming an adhesive layer on the base material, a material of the adhesive layer comprising titanium, tantalum, indium tin oxide, or a combination thereof.

5. The method for manufacturing the electrode according to claim 4, wherein a method of forming the adhesive layer comprises a PVD or a CVD.

6. The method for manufacturing the electrode according to claim 1, wherein after the planarization process, a thickness of the RF PVD transition metal compound layer is reduced.

7. The method for manufacturing the electrode according to claim 1, wherein the entire top surface of the remained RF PVD transition metal compound layer is flat and in a same planar, and an entire top surface of the conductive layer is flat and in a same planar.

8. The method for manufacturing the electrode according to claim 1, wherein after performing the planarization process, the topmost surface of the conductive layer is completely covered by the remained RF PVD transition metal compound layer.

* * * * *